United States Patent
Hultermans

(10) Patent No.: US 6,586,754 B1
(45) Date of Patent: Jul. 1, 2003

(54) SERVO CONTROL, AND ITS APPLICATION IN A LITHOGRAPHIC PROJECTION APPARATUS

(75) Inventor: Sebastiaan C. Hultermans, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/478,512

(22) Filed: Jan. 6, 2000

(30) Foreign Application Priority Data

Jan. 8, 1999 (EP) .............................................. 99200032

(51) Int. Cl.⁷ ............................................. G03B 27/42
(52) U.S. Cl. ..................................... 250/492.2; 250/310
(58) Field of Search ................................ 250/492.2, 310; 355/53; 430/22

(56) References Cited

U.S. PATENT DOCUMENTS

| | | | |
|---|---|---|---|
| 4,993,696 A | | 2/1991 | Furukawa et al. |
| 5,049,745 A | * | 9/1991 | Vogen et al. ............... 250/310 |
| 5,623,853 A | * | 4/1997 | Novak et al. ................. 355/53 |
| 5,811,821 A | * | 9/1998 | Alexander et al. ..... 250/440.11 |
| 5,822,389 A | * | 10/1998 | Uzawa et al. ................. 378/34 |
| 5,879,842 A | * | 3/1999 | Okino ......................... 430/22 |
| 5,963,306 A | * | 10/1999 | Tanitsu et al. ................ 355/67 |
| 5,986,743 A | | 11/1999 | Hanzawa |
| 6,043,490 A | * | 3/2000 | Sakai ......................... 250/310 |
| 6,082,690 A | * | 7/2000 | Durin et al. ............. 211/90.01 |
| 6,097,473 A | * | 8/2000 | Ota et al. ...................... 355/53 |
| 6,183,817 B1 | * | 2/2001 | Gersonde .................... 427/561 |
| 6,211,946 B1 | * | 4/2001 | Ohtomo et al. ............... 355/53 |
| 6,252,234 B1 | * | 6/2001 | Hazelton et al. ....... 250/442.11 |
| 6,420,716 B1 | * | 7/2002 | Cox et al. ................ 250/492.2 |

OTHER PUBLICATIONS

Patent Abstracts of Japan: Japanese Publication Number 09289155, published Nov. 4, 1997 on Application No. 08122329, Application date Apr. 19, 1996.

\* cited by examiner

Primary Examiner—John R. Lee
Assistant Examiner—Anthony Quash
(74) Attorney, Agent, or Firm—Pillsbury Winthrop LLP

(57) ABSTRACT

In a photolithography apparatus, a cable slab 16 carries compressed air, coolant and/or power supply channels from a stationary frame 19 to a wafer table 12. Forces exerted on the moveable table 12 by the cable slab 16 are measured by a force sensor 17 mounted between the moveable table 12 and a mounting bracket 16a for the cable slab. Control signals are generated from the force signals outputted by the force sensor 17, and applied to linear electric motors which drive the wafer table to counteract the effects of forces exerted on the wafer table by the cable slab 16.

12 Claims, 2 Drawing Sheets

SERVO CONTROL, AND ITS APPLICATION IN A LITHOGRAPHIC PROJECTION APPARATUS

The present invention relates to servo control methods and apparatus for use in a lithographic projection apparatus.

Lithographic projection apparatus can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of photosensitive material (resist). In general, a single wafer will contain a whole network of adjacent dies which are successively irradiated through the reticle, one at a time. In one type of lithographic projection apparatus, each die is irradiated by exposing the entire reticle pattern onto the die in one go; such an apparatus is commonly referred to as a waferstepper. In an alternative apparatus—which is commonly referred to as a step-and-scan apparatus—each die is irradiated by progressively scanning the reticle pattern through the projection beam in a given reference direction (the "scanning" direction) while synchronously scanning the wafer table parallel or anti-parallel to this direction; since, in general, the projection system will have a magnification factor M (generally <1), the speed v at which the wafer table is scanned will be a factor M times that at which the reticle table is scanned. In both types of apparatus, after each die has been imaged onto the wafer, the wafer table can be "stepped" to a new position so as to allow imaging of a subsequent die. More information with regard to lithographic devices as here described can be gleaned from International Patent Applications WO 97/33205 and WO 96/38764, for example.

Up to very recently, apparatus of this type contained a single mask table and a single substrate table. However, machines are now becoming available in which there are at least two independently movable substrate tables; see, for example, the multi-stage apparatus described in International Patent Applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial alignment measurements on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn improves the cost of ownership of the machine.

The projection radiation in current lithographic devices is generally UV (ultra-violet) light with a wavelength of 365 nm, 248 nm or 193 nm. However, the continual shrinkage of design rules in the semiconductor industry is leading to an increasing demand for new radiation types. Current candidates for the near future include UV light with wavelengths of 157 nm or 126 nm, as well as extreme UV light (EUV) and particle beams (e.g. electron or ion beams).

In a lithographic projection apparatus, it is necessary to control the position of the wafer table and the reticle table to an extremely high degree of accuracy, throughout multiple exposures. Vibrations in these stages may be caused inter alia by floor vibrations, indirect stepping forces, air mount noise or acoustic noise. Such vibrations reduce the image quality of the exposure; however, if operation of the system is paused so as to allow the vibrations to fade away between each exposure, this generally causes an undesirable reduction in throughput.

A particularly important characteristic of a lithographic projection apparatus is its so-called overlay precision. In a typical projection procedure, each target portion of the substrate will be subjected to various exposures, in successive irradiation sessions. These exposures will typically result in patterned layers (e.g. the circuit patterns in the various semiconductor layers of an IC) which will have to be accurately overlapped with one another. The overlay precision expresses the accuracy with which such overlap can be reproducibly achieved, and it is often of the order of nanometers. Vibrations from various sources can be transferred inter alia to the mask and substrate tables, where they can have a highly detrimental effect on the achievement of the required overlay accuracy.

It should be noted that, whilst it is relatively easy to detect the existence of vibrations as hereabove described, it requires considerable work to identify and eliminate their sources.

SUMMARY OF THE INVENTION

It is an object of the invention to address and alleviate this problem.

This and other objects are achieved according to the present invention in a lithographic projection apparatus comprising a flexible conduit carrier which connects at least a first of the movable tables to a frame outside that table.

a force sensor for measuring forces exerted on the first table by the conduit carrier and generating a force signal representative of said forces; and a motion controller responsive to said force signal, for generating control signals to cause the positioning means connected to the first table to apply compensatory forces to that table.

The term "conduit carrier" as here employed refers to the "umbilical cord" which generally connects at least one of the movable tables to the outside frame (e.g. a metrology frame) and which carries such items as power cords, signal carriers, air tubes (e.g. for supplying air to an air bearing in the table), coolant tubes, etc. The mask table and/or the substrate table may be connected to an outside frame in this manner (using a distinct conduit carrier for each table); consequently, the term "first table" as here employed generally encompasses both the mask table and the substrate table.

In experiments leading to the invention, the inventors performed investigations with a test lithographic apparatus, and concentrated on the achievable overlay precision with that apparatus. Although the measured precision was relatively satisfactory in the light of current standards in the semiconductor industry, it matched less satisfactorily with the standards expected to be introduced in the near future (as projection wavelengths decrease and feature sizes continue to shrink). Consequently, methods were sought to improve the attainable overlay. After much experimentation, it was eventually observed that the conduit carrier between the substrate table and the outside world was an important source of table vibration. This phenomenon was initially tackled by attempting a redesign of the conduit carrier (different materials, different dimensions, different forms, etc.), but the results of such redesigns were rather disappointing. Eventually, having realized that the phenomenon could not be alleviated in this manner, the inventors adopted an alternative approach: that of measurement and compensation instead of removal. This approach resulted in the current invention.

The present invention also provides a method of controlling the position of a movable table in a lithographic projection apparatus in which a flexible conduit carrier connects the said table to a frame outside the table, the method comprising:

measuring forces exerted on the table by the conduit carrier;

generating control signals indicative of compensatory forces to be applied to the table; and applying compensatory forces to the table in response to said control signals, so as to counteract the effects of said forces exerted by the conduit carrier on the table.

The feedforward control provided by the present invention can provide a substantial improvement in the positioning accuracy of a movable table (e.g. a wafer table), and particularly the repeatability of positioning, by substantially compensating for the effects of vibrations caused by the presence and motion of the conduit carrier.

In a manufacturing process using a lithographic projection apparatus according to the invention, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

DESCRIPTION OF THE DRAWINGS

The present invention will be described below with reference to exemplary embodiments and the accompanying schematic drawings, in which.

In the figures, like reference symbols indicate like parts.

DETAILED DESCRIPTION

Embodiment 1

Figure 1:
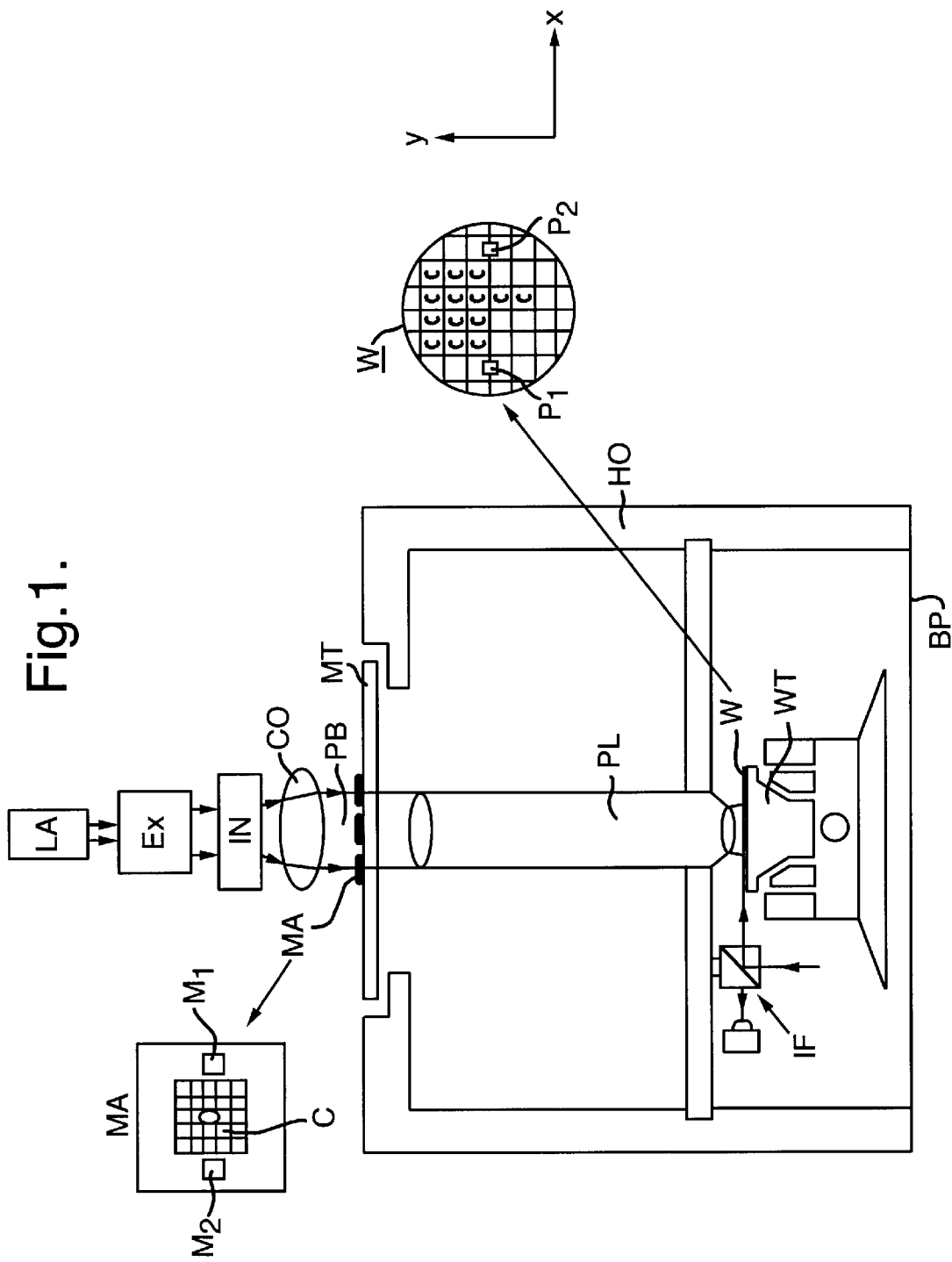
FIG. 1 depicts a lithographic projection apparatus according to the invention.

FIG. 1 schematically depicts a lithographic projection apparatus according to the invention. The apparatus comprises:

a radiation system LA, Ex, IN, CO for supplying a projection beam PB of radiation (e.g. UV or EUV radiation, electrons or ions);

a movable mask table (reticle table) MT provided with a mask holder for holding a mask (reticle) MA, and connected to mask table positioning means PM for accurately positioning the mask with respect to item PL;

a movable substrate table (wafer table) WT provided with a substrate holder for holding a substrate W (e.g. a resist-coated silicon wafer), and connected to substrate table positioning means PW for accurately positioning the substrate with respect to item PL;

a projection system PL (e.g. a refractive or catadioptric system, a mirror group or an array of field deflectors) for imaging an irradiated portion of the mask MA onto a target portion C (die) of the substrate W. For simplicity, item PL may be referred to as the "lens".

Figure 2:
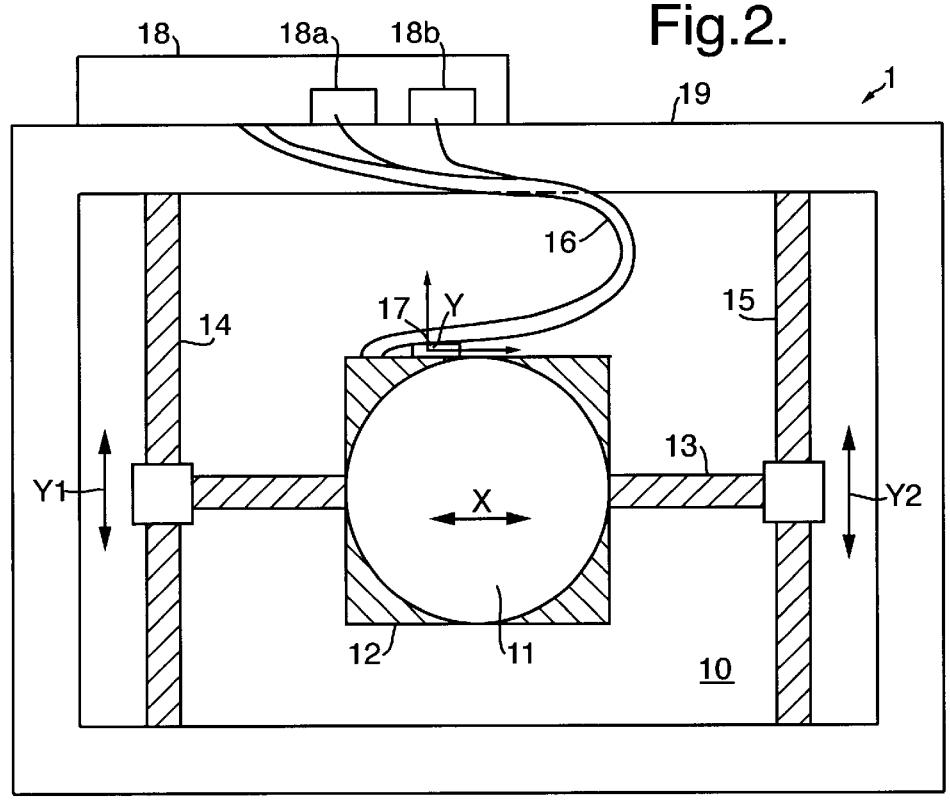
FIG. 2 is a diagram of relevant components of a lithographic projection apparatus to which the present invention is applied.

The positioning means PM and PW are not explicitly depicted in FIG. 1, but may be of a type as depicted in FIG. 2 and explained in Embodiment 2, for example. As here depicted, the lithographic projection apparatus is transmissive, i.e. it has a transmissive reticle and purely refractive lens; however, the apparatus may also be (at least partially) reflective, for example.

The radiation system comprises a source LA (e.g. a Hg lamp or excimer laser, a source of EUV such as an undulator provided around the path of a particle beam from an accelerator, or an electron or ion gun) which produces a beam of radiation. This beam is passed along various optical components,—e.g. beam shaping optics Ex, an integrator IN and a condensor CO—so that the resultant beam PB has a desired form and intensity distribution in its cross-section.

The beam PB subsequently intercepts the mask MA which is held in a mask holder on the mask table MT. Having traversed the mask MA, the beam PB passes through the lens PL, which focuses the beam PB onto a target area C of the substrate W. With the aid of the interferometric displacement and measuring means PW, the substrate table WT can be moved accurately, e.g. so as to position different target areas C in the path of the beam PB. Similarly, the positioning means PM can be used to accurately position the mask MA with respect to the path of the beam PB, e.g. after mechanical retrieval of the mask MA from a mask library. In general, movement of the tables MT, WT will be realized with the aid of a long stroke module (course positioning) and a short stroke module (fine positioning), which are not explicitly depicted in FIG. 1.

The depicted apparatus can be used in two different modes:

In step mode, the mask table MT is kept essentially stationary, and an entire mask image is projected in one go (i.e. a single "flash") onto a target area C. The substrate table WT is then shifted in the X and/or Y directions so that a different target area C can be irradiated by the beam PB;

In scan mode, essentially the same scenario applies, except that a given target area C is not exposed in a single "flash". Instead, the mask table MT is movable in a given direction (the so-called "scan direction", e.g. the Y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target area C can be exposed, without having to compromise on resolution.

Vibrations from various sources can be transferred inter alia to the tables MT, WT, where they can have a highly detrimental effect on the achievement of the required overlay accuracy. The present invention can be used to alleviate this problem, e.g. as described in Embodiment 2.

Embodiment 2

FIG. 2 is a schematic diagram of the relevant components of a stepper-type lithographic projection apparatus ("lithography device") 1 to which the present invention is applied. As shown in FIG. 2, a granite stone 10 provides support for the movable wafer table ("chuck") 12, which in turn supports the wafer 11 which is to be exposed by the lithography device. The chuck 12, when operating, floats over the stone 10 on an air bearing, and can be positioned under the projection lens of the apparatus by three linear motors arranged in an H-configuration. X-motor 13 controls the position of the chuck 12 in the X-direction, whilst Y1-motor 14 and Y2-motor 15 are independently moveable along Y1 and Y2 axes, which are substantially orthogonal to the X-direction, to position the chuck 12 both in the Y-direction and rotationally (Rz). Each of the three motors 13, 14 and 15 operates, for example, on the basis of Lorentz forces and according to well established principles, and comprises:

- an elongate track (stator) which is provided with a "herringbone" pattern of permanent-magnet segments, and;
- a movable "rider" which is provided with a system of field coils and can slide along he said track in response to the passage of electrical currents through the field coils. Short-stroke actuators for fine positioning of the chuck 12 in at least X, Y and Rz are provided between the chuck 12 and the stone 10, and are not explicitly depicted in FIG. 2.

A conduit carrier ("cable slab" or "umbilical cord") 16 connects the chuck 12 to terminal block 18, which is mounted on the metrology frame 19. The cable slab 16 provides conduits inter alia for compressed air, coolant, electrical power cables and signal cables. As the chuck 12 moves about on the stone 10, the cable slab 16 folds and unfolds to follow its movements.

The present inventors have determined that particularly troublesome vibrations in a frequency-range 4–18 Hz are caused by the cable slab 16 as it settles into a new position after each movement of the chuck 12. A force sensor ("force sensing means"), or load cell, 17 is therefore provided in the mounting on the chuck 12 to which the cable slab 16 is connected, and its output used to generate compensatory forces that are applied to the chuck 12 via the linear motors 13, 14 and 15. Output signals from the force sensor are carried by coaxial cables included in the cable slab 16.

The magnitude of the forces to be detected will depend on the actual application, and particularly the size and shape of the cable slab 16. In this embodiment, the force sensor should be capable of detecting forces in the range 0.1–20 N with an accuracy of 10 mN and over a frequency range of 1 to 50 Hz. A suitable example of a force sensor usable in the invention is the Quartz sensor ref 9251A manufactured by Kistler Instrumente AG of Switzerland; this sensor can measure rotational forces about the Z axis as well, but this channel may not be necessary in certain applications. Alternative sensors for use according to the invention are the model Delta 330/30 sensor supplied by the firm ATI Industrial Automation, and the model FGP bidirectional miniature force transducer supplied by the firm J&M, for example.

Figure 3:
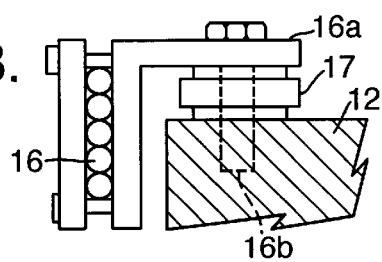
FIG. 3 is an enlarged partly sectional view showing a possible mounting of the force sensor.

As shown in FIG. 3, the force sensor 17 is bolted directly between the chuck 12 and the bracket 16a that clamps the end of the cable slab 16. In this manner, the force sensor 17 can give a direct indication of the forces exerted on the chuck 12 by the cable slab 16. The very high mechanical stiffness of the sensor assembly allows very accurate measurement of forces exerted on the upper part of the mounting bolt, and the upper part of the load cell (in the sense as depicted in FIG. 3).

Figure 4:
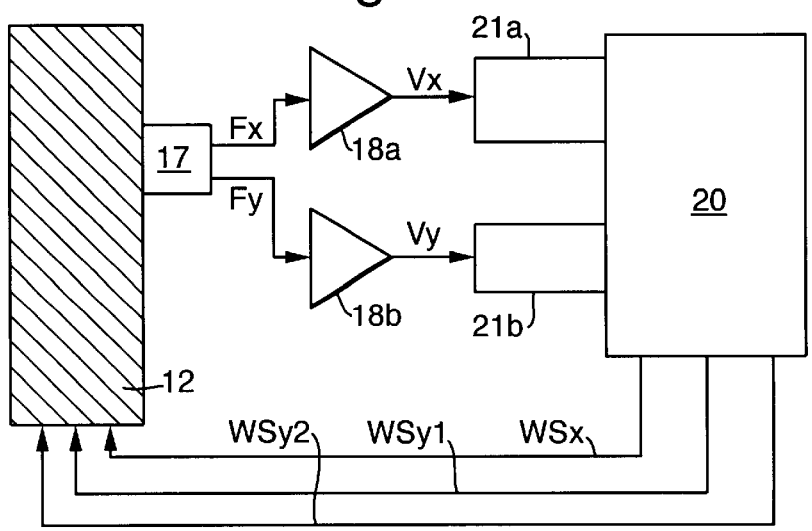
FIG. 4 is a block diagram of a control system according to the present invention.

The control system for generation of the control signals is shown in block form in FIG. 4.

Output signals Fx and Fy, which represent the forces in the X- and Y-directions detected by the force sensor 17, are supplied to load amplifiers 18a and 18b located in the terminal block 18, as shown in FIG. 2. If, as in this case, the force sensor is of the piezoelectric type, the output signals will be charge signals, and these are converted into voltage signals Vx and Vy in the load amplifiers 18a, 18b. The load amplifiers 18a, 18b are situated in the terminal block 18 to minimize the effect of electrical noise picked up by the sensor leads, whilst avoiding placing any unnecessary weight on the chuck 12. The remainder of the control system may be situated more remotely from the wafer table.

X- and Y-motion controllers 21a, 21b receive the voltage signals Vx and Vy, and generate appropriate compensating motions to be applied to the chuck 12. The stepper controller 20 combines these signals with other control signals relating to other desired motions of the chuck 12, and combined wafer table control signals WSx, WSy1 and WSy2 are outputted to the linear motors 13, 14 and 15. Low-pass filters with a cut-off of 30 Hz, for example, are provided in the input to the controllers 21a, 21b, so to eliminate any higher-frequency components that may have been generated by electrical noise rather than actual physical movements.

Trials with the invention have shown that it can reduce maximum "DY errors", which represent the accuracy with which the wafer can be returned to the same position for multiple exposures. Without application of the invention, a reference sample of three wafers in a test apparatus exhibited DY errors of 19.2 to 24.9 nm at an equivalent wafer throughput of 88 wafers per hour. With the invention, maximum DY errors were reduced to between 12.4 and 13.5 nm.

As illustrated, the force sensor detects only forces in the X and Y directions; however a sensor measuring rotational forces about the Z axis (Rz forces) may also be provided. In that case, an additional load amplifier and motion controller will be provided. If necessary, conversion between the X-Y-Rz coordinate system and the X-Y1-Y2 coordinate system can be carried out either in the motion controllers 21a, 21b or in the stepper controller 20.

This embodiment of the invention uses a single sensor to measure forces in both the X and Y directions. Alternatively, separate sensors may be provided. Forces on three axes may similarly be measured using separate X, Y and Rz sensors or X, Y1 and Y2 sensors.

The arrangement illustrated in FIG. 2 is particularly suitable for use as (part of) a wafer stage in a lithographic projection apparatus. In the case of a reticle stage for use with a transmissive reticle, the chuck 12 and stone 10 will have to contain a suitable aperture, in order to allow the transmission of projection radiation through the stage (from the radiation system to the projection system). For application in a stepper, such a reticle stage will generally not require the motors 13, 14 and 15, since short-stroke motion of the chuck 12 will generally be sufficient. On the other hand, in the case of a step-and-scan device, the motors 14 and 15 will be sufficient for long-stroke actuation in the Y-direction (scan direction), and the long-stroke motor 13 will generally be unnecessary (since only short-stroke actuation in X will generally be required).

What is claimed is:

1. A lithographic projection apparatus comprising:
    a radiation system for supplying a projection beam of radiation;
    a movable mask table provided with a mask holder for holding a mask, and connected to a mask table positioning mechanism;
    a movable wafer table provided with a substrate holder for holding a substrate, and connected to said substrate table positioning mechanism;
    a projection system for imaging an irradiated portion of the mask onto a target portion of the substrate;
    a flexible conduit carrier which connects at least one of said movable mask table and said movable wafer table to a frame outside that table;
    a force sensor for measuring forces exerted on the said at least one table by the conduit carrier and generating a force signal representative of said forces; and
    a motion controller responsive to said force signal, for generating control signals to cause the positioning means connected to the said at least one table to apply compensatory forces to that table.

2. An apparatus according to claim 1, wherein the said at least one table is movable along at least two displacement axes, and the force sensor is adapted to detect forces acting in at least two force axes.

3. An apparatus according to claim 2, wherein said two force axes are substantially orthogonal.

4. An apparatus according to claim 1, 2 or 3, further comprising a low-pass filter for low-pass filtering the force signal outputted by the force sensor.

5. An apparatus according to claim 4, wherein the low-pass filter has a cut-off frequency in the range 20–40 Hz.

6. An apparatus according to claim 1, wherein the force sensor is a piezo-electric sensor, further comprising at least one load amplifier for converting a charge signal, outputted by the force sensor as the said force signal, into a voltage signal.

7. An apparatus according to claim 1, wherein said conduit carrier comprises at least one channel selected from the group comprising: a compressed air supply channel, a coolant supply channel, an electrical power supply channel, a control signal channel, and a sensor signal channel.

8. An apparatus according to claim 1, further comprising a bracket for mounting an end of said conduit carrier to the said at least one table, and wherein the force sensor is mounted between said bracket and the at least one table.

9. A method of controlling the position of a movable table in a lithographic projection apparatus in which a flexible conduit carrier connects the said table to a frame outside the table, the method comprising:
    measuring forces exerted on the table by the conduit carrier;
    generating control signals indicative of compensatory forces to be applied to the table; and
    applying compensatory forces to the table in response to said control signals, so as to counteract the effects of said forces exerted by the conduit carrier on the table.

10. A method according to claim 9, wherein said forces exerted on said table are measured in at least two substantially orthogonal directions.

11. A device manufacturing method comprising:
    providing a substrate that is at least partially covered by a layer of radiation-sensitive material;
    providing a mask which contains a pattern;
    using a projection beam of radiation to project an image of at least part of the mask pattern onto a target area of the layer of radiation-sensitive material,
    whereby at least one of the substrate and the mask is held on a movable object table that is connected to a positioning mechanism, and is also connected to a frame outside the table via a flexible conduit carrier;
    measuring forces exerted on the object table by the conduit carrier, and generating a force signal representative of said forces; and
    generating control signals responsive to said force signal to cause the said positioning means to apply compensatory forces to the object table.

12. A device manufactured using the method claimed in claim 11.

* * * * *